US012004428B2

(12) United States Patent
Ho et al.

(10) Patent No.: US 12,004,428 B2
(45) Date of Patent: Jun. 4, 2024

(54) OSCILLATOR FREQUENCY MODULATION METHOD AND OSCILLATOR PIEZOELECTRIC STRUCTURE

(71) Applicant: National Central University, Taoyuan (TW)

(72) Inventors: Jeng-Rong Ho, Tao-Yuan (TW); Chih-Kuang Lin, Tao-Yuan (TW); Pi-Cheng Tung, Tao-Yuan (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 17/693,459

(22) Filed: Mar. 14, 2022

(65) Prior Publication Data
US 2023/0132534 A1 May 4, 2023

(30) Foreign Application Priority Data
Oct. 28, 2021 (TW) ................................. 110140008

(51) Int. Cl.
| | | |
|---|---|---|
| *H10N 30/082* | (2023.01) | |
| *H03B 5/32* | (2006.01) | |
| *H10N 30/088* | (2023.01) | |
| *H10N 30/09* | (2023.01) | |
| *H10N 30/853* | (2023.01) | |

(52) U.S. Cl.
CPC ............ *H10N 30/082* (2023.02); *H03B 5/32* (2013.01); *H10N 30/088* (2023.02); *H10N 30/09* (2023.02); *H10N 30/853* (2023.02)

(58) Field of Classification Search
CPC .... H10N 30/082; H10N 30/088; H10N 30/09; H10N 30/853; H03B 5/32
See application file for complete search history.

(56) References Cited

U.S. PATENT DOCUMENTS

| | | | | |
|---|---|---|---|---|
| 2001/0042291 | A1* | 11/2001 | Esashi ................. | H10N 30/082 29/25.35 |
| 2007/0046154 | A1* | 3/2007 | Ifuku ..................... | B41J 2/1631 310/358 |
| 2008/0143450 | A1* | 6/2008 | Matsumoto .............. | H03B 5/36 29/25.35 |
| 2009/0077781 | A1* | 3/2009 | Amano .................. | H10N 30/06 29/25.35 |

(Continued)

FOREIGN PATENT DOCUMENTS

| | | | | |
|---|---|---|---|---|
| CA | 2609905 | A1 * | 12/2006 | ............. B22F 10/20 |
| CN | 110277973 | A | 9/2019 | |

(Continued)

*Primary Examiner* — Jeffrey T Carley

(57) ABSTRACT

An oscillator frequency modulation method includes: providing a piezoelectric material having a surface and an interior; and performing a pattern process on the piezoelectric material by a laser. A patterned processing zone is formed on the surface and/or in the interior of the piezoelectric material. The pattern process may be a material removal and/or a material modification. Therefore, without changing the appearance of the piezoelectric material, the pattern process on the piezoelectric material through the laser can accurately adjust the frequency of the oscillator and block unnecessary mode at the same time. An oscillator piezoelectric structure with frequency modulation is also provided.

5 Claims, 5 Drawing Sheets

(56) References Cited

U.S. PATENT DOCUMENTS

| | | | | |
|---|---|---|---|---|
| 2009/0236933 A1* | 9/2009 | Takahashi | H10N 30/883 | 29/25.35 |
| 2011/0107962 A1* | 5/2011 | Chen | H10N 30/074 | 29/25.35 |
| 2011/0203083 A1* | 8/2011 | Sasaki | H03H 9/177 | 29/25.35 |
| 2011/0234708 A1* | 9/2011 | Nakayama | B41J 2/14233 | 29/25.35 |
| 2012/0182358 A1* | 7/2012 | Miyazawa | B41J 2/14233 | 347/68 |
| 2012/0217430 A1* | 8/2012 | Sakai | H10N 30/853 | 252/62.9 PZ |
| 2012/0304429 A1* | 12/2012 | Horikiri | H10N 30/076 | 29/25.35 |
| 2014/0240405 A1* | 8/2014 | Furuya | B41J 2/14201 | 310/365 |
| 2014/0284302 A1* | 9/2014 | Hahiro | B41J 2/1642 | 216/13 |
| 2016/0079514 A1* | 3/2016 | Tai | H10N 30/88 | 29/25.35 |
| 2016/0082735 A1* | 3/2016 | Furuya | B41J 2/1632 | 29/25.35 |
| 2017/0096006 A1* | 4/2017 | Nakayama | B41J 2/161 | |
| 2017/0155030 A1* | 6/2017 | Matsuda | H10N 30/05 | |
| 2017/0197414 A1* | 7/2017 | Naganuma | B41J 2/14201 | |
| 2018/0062064 A1* | 3/2018 | Kobayashi | F04B 43/095 | |
| 2018/0297363 A1* | 10/2018 | Nakayama | B41J 2/045 | |
| 2019/0123710 A1* | 4/2019 | Plesski | H03H 9/6406 | |
| 2019/0262865 A1* | 8/2019 | Mehdizadeh | B06B 1/0644 | |
| 2020/0069890 A1* | 3/2020 | Vigevani | H10N 30/853 | |
| 2020/0179979 A1* | 6/2020 | Jin | B06B 3/00 | |

FOREIGN PATENT DOCUMENTS

| | | | | |
|---|---|---|---|---|
| CN | 110462485 A | * | 11/2019 | B81B 3/00 |
| JP | 2011086903 A | * | 4/2011 | B41J 2/055 |
| JP | 2011159945 A | * | 8/2011 | B41J 2/055 |
| JP | 2012148494 A | * | 8/2012 | B41J 2/14233 |
| WO | WO-2011162305 A1 | * | 12/2011 | G01L 1/16 |

\* cited by examiner

OSCILLATOR FREQUENCY MODULATION METHOD AND OSCILLATOR PIEZOELECTRIC STRUCTURE

FIELD OF THE INVENTION

The present invention relates to a frequency modulation technology, and more particularly to an oscillator frequency modulation method and an oscillator piezoelectric structure.

BACKGROUND OF THE INVENTION

Piezoelectric effect is a phenomenon of mutual conversion between mechanical energy and electrical energy. The piezoelectric effect includes positive piezoelectric effect and negative piezoelectric effect. The negative piezoelectric effect means a process in which electrical energy is converted into mechanical energy when the piezoelectric material is deformed caused by being applied with an electric field. Common piezoelectric materials are quartz, ceramics, etc.

Quartz oscillators are made of piezoelectric quartz slices. Based on the mechanical and electrical coupling, the quartz slice will oscillate when an AC electric field is applied to the electrodes on the upper and lower surfaces of the quartz slice. Resonance effect may occur if the natural frequency of the quartz slice is consistent to the frequency of the AC electric field, and the resonance effect may causes the amplitude of the oscillation larger. In addition, the cutting angle of the quartz grain slices, different electrode shapes and poling processes may all cause the quartz slices to generate different oscillation modes, such as flexural mode, longitudinal mode, face shear mode and thickness shear mode, etc. Most of the conventional quartz oscillators control the frequency by modifying the appearance and size (mass) of the quartz. However, the high hardness of quartz makes it difficult to be processed, which increases the difficulty of controlling the frequency of the oscillator. In addition, other unnecessary modes may occur while the quartz oscillates.

SUMMARY OF THE INVENTION

To solve the above-mentioned problems, the present invention provides an oscillator frequency modulation method and an oscillator piezoelectric structure. Specifically, a pattern process is performed on the surface or in the interior of the piezoelectric material of an oscillator to change the frequency of the piezoelectric material. Thus, there is no need to overcome the problem in which it is difficult to cut and shape the hard piezoelectric materials (such as quartz) or the problem in which it is required to use a laser to make a micro-cutting on part of the electrode surface to change the mass of the piezoelectric materials in prior art. The present invention achieves the effect of a spatial filter through a designed pattern process to eliminate unnecessary oscillation modes and the corresponding frequencies. As a result, without changing the appearance of the piezoelectric material, the present invention accurately adjusts the frequency of the oscillator by performing the pattern process on the piezoelectric material and blocks unnecessary modes and the corresponding frequencies at the same time.

The oscillator frequency modulation method provided by the present invention includes steps of: providing a piezoelectric material, wherein the piezoelectric material includes a surface and an interior; and performing a pattern process on the piezoelectric material to form a patterned processing zone on the surface or in the interior of the piezoelectric material, wherein the pattern process includes a material removal, a material modification, or a combination thereof.

The pattern process of the present invention may consist of laser, dry etching (e.g., plasma or ion beam), wet etching, machining, heat treatment, or a combination thereof.

The oscillator piezoelectric structure provided by the present invention includes a piezoelectric material. The piezoelectric material has a surface and an interior. A patterned processing zone is formed on the surface, in the interior, or a combination thereof. Each patterned processing zone includes a material removal area, a material modification area, or a combination thereof. The material removal area or the material modification area is formed by laser, dry etching (e.g., plasma or ion beam), wet etching, machining, heat treatment, or a combination thereof.

In an embodiment of the present invention, the pattern process is a material removal, and the patterned processing zone is a material removal area, wherein the material removal area is a structure such as blind holes, through holes, recesses, grooves, or a combination thereof.

In an embodiment of the present invention, a number of the patterned processing zones is one or more, and the patterned processing zone(s) is arranged on the surface, in the interior, or a combination thereof of the piezoelectric material.

In an embodiment of the present invention, the pattern process is performed on the surface, in the interior, or a combination thereof of the piezoelectric material to form an even or matrix distributed structure.

In an embodiment of the present invention, the piezoelectric material may include one of quartz, ceramic, and polyvinylidene fluoride (PVDF).

In the present invention, a pattern process is performed on the surface or in the interior or a combination thereof of the piezoelectric material of an oscillator to change the frequency of the piezoelectric material. Thus, the problem in which it is difficult to process the hard piezoelectric materials or the problem in which it is required to use a laser to make a micro-cutting on part of the electrode surface to change the mass of the piezoelectric materials in prior art. In addition, the present invention can achieve the effect of a spatial filter by designing various fine patterns through performing the material removal or the material modification on the piezoelectric material, so as to eliminate unnecessary oscillation modes and the corresponding frequencies and block unnecessary modes and the corresponding frequencies.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
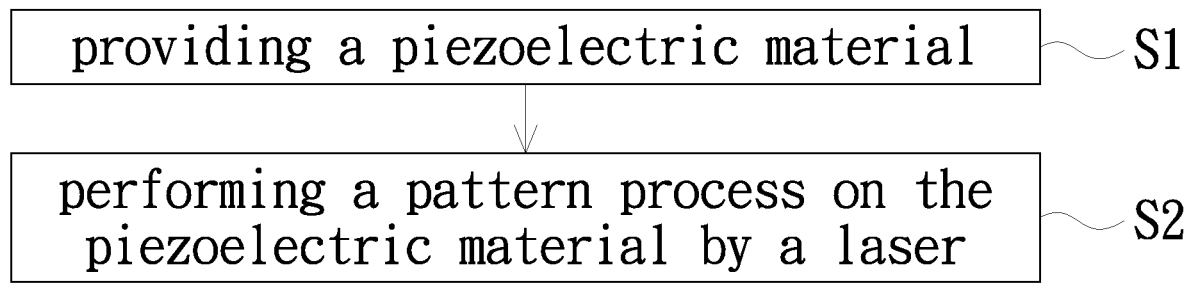
FIG. 1 is a schematic flowchart of an oscillator frequency modulation method according to an embodiment of the present invention.

FIG. 1 is a schematic flowchart of an oscillator frequency modulation method according to an embodiment of the present invention. As shown in FIG. 1, the oscillator frequency modulation method includes: providing a piezoelectric material (step S1). The piezoelectric material is, for example, quartz, ceramic, or polyvinylidene difluoride (PVDF). In one embodiment, the piezoelectric material is plate-shaped quartz, but is not limited thereto. The piezoelectric material includes a surface and an interior.

The oscillator frequency modulation method further includes: performing a pattern process on the piezoelectric material by a laser (step S2) to form a patterned processing zone on at least one of the surface and the interior of the piezoelectric material. The pattern process may include a material removal, a material modification, or a combination thereof. Specifically, the material removal is, for example, to form a combination of microstructure patterns such as through holes, blind holes, recesses, grooves, etc. on the piezoelectric material. The material modification is, for example, to change the material lattice structure of the piezoelectric material to change the material properties of the piezoelectric material. Taking the piezoelectric material as a quartz crystal as an example, the lattice structure of the quartz crystal is changed through the irradiation of the laser, thereby changing the material properties of the quartz crystal in some areas. In addition, the pattern process is not limited to laser. In other embodiments not shown, dry etching (e.g., plasma or ion beam), wet etching, machining, heat treatment, or a combination thereof may also be used.

Figure 2A:
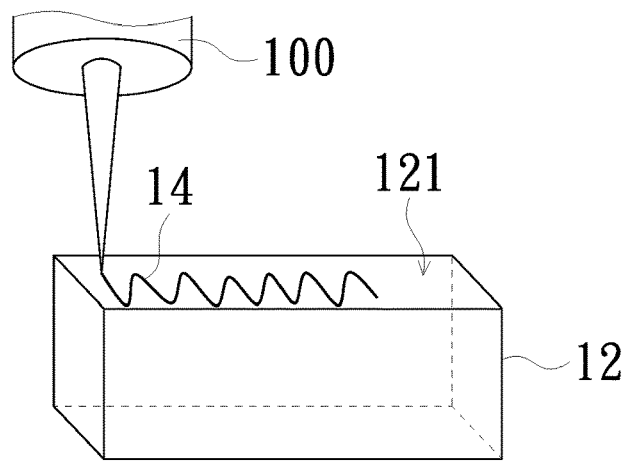
FIGS. 2A to 2C are schematic diagrams for illustrating different processes on a piezoelectric material by a laser according to an embodiment of the present invention.
Figure 2B:
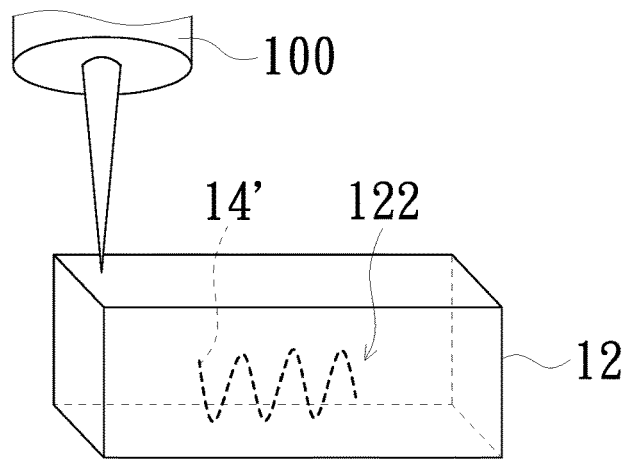
Figure 2C:
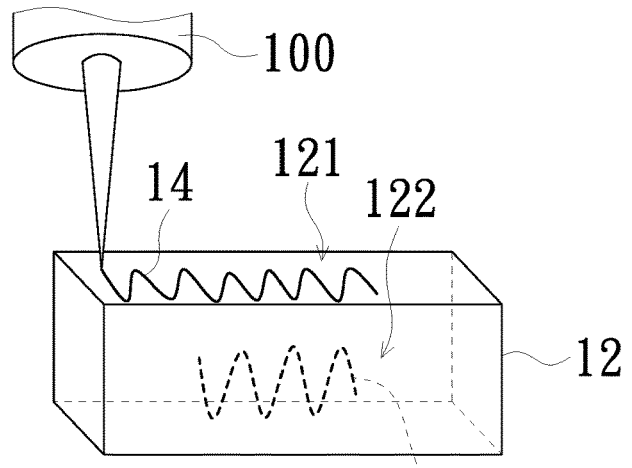

FIGS. 2A to 2C are schematic diagrams for illustrating different processes on a piezoelectric material by a laser according to an embodiment of the present invention. As shown in FIG. 2A, a laser device 100 is used to perform a pattern process on the surface 121 of the piezoelectric material 12 to form a patterned processing zone 14 on the surface 121. As shown in FIG. 2B, the laser device 100 is used to perform a pattern process in the interior 122 of the piezoelectric material 12 to form a patterned processing zone 14' in the interior 122. As shown in FIG. 2C, the laser device 100 is used to perform a pattern process on the surface 121 and in the interior 122 of the piezoelectric material 12 to form the patterned processing zones 14, 14' on the surface 121 and in the interior 122, respectively. That is, the pattern process may select a specific area of the piezoelectric material 12 to perform the material removal, the material modification, or a combination thereof according to the subsequent modulation of the oscillation frequency of the piezoelectric material 12 and the need to block unnecessary modes and their corresponding frequencies. The patterned processing zones 14, 14' formed on the piezoelectric material 12 by the pattern process may have various identical or different shapes. The patterned processing zones 14, 14' of the piezoelectric material 12 may be distributed, for example, on the peripheral area of the surface 121 and/or the peripheral area of the interior 122 of the piezoelectric material 12, or distributed evenly or in a matrix on the surface 121 and/or in the interior 122 of the piezoelectric material 12, or distributed non-evenly on the surface 121 and/or in the interior 122 of the piezoelectric material 12, etc.

Figure 3:
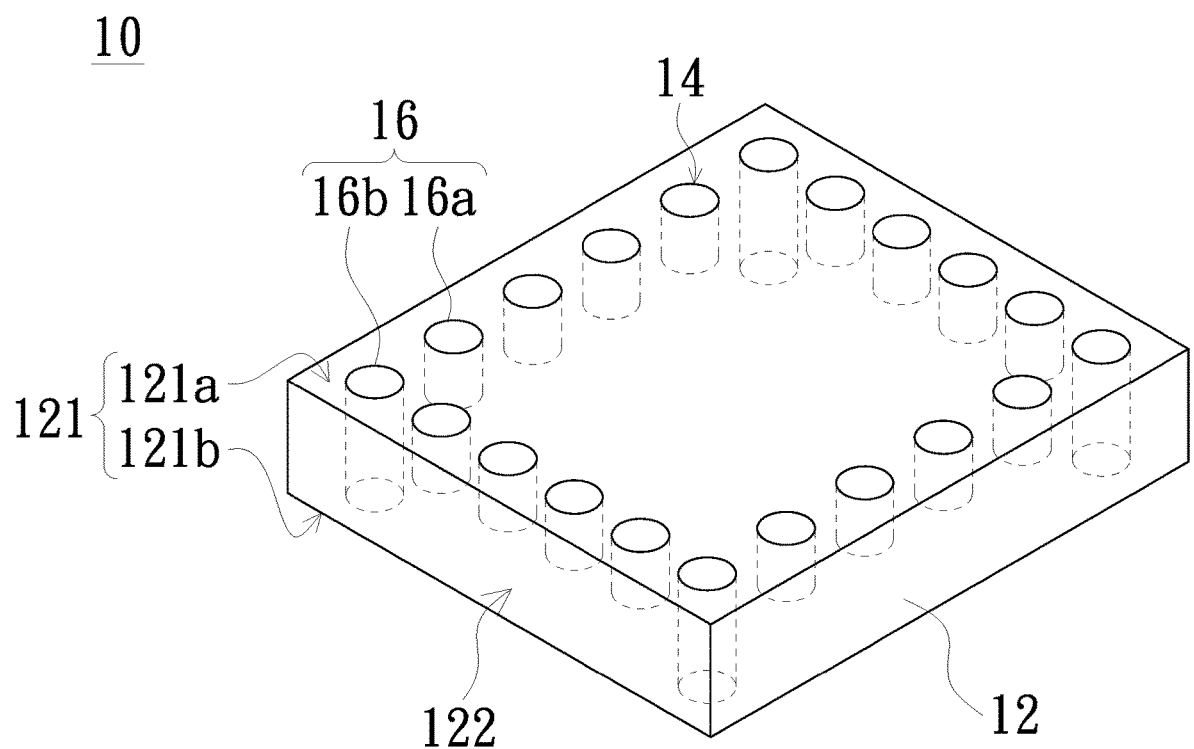
FIG. 3 is a structural schematic diagram of an oscillator piezoelectric structure according to an embodiment of the present invention.

FIG. 3 is a structural schematic diagram of an oscillator piezoelectric structure according to an embodiment of the present invention. As shown in FIG. 3, the oscillator piezoelectric structure 10 includes a piezoelectric material 12. The piezoelectric material 12 is, for example, a plate-shaped quartz crystal, but is not limited thereto. The piezoelectric material 12 may also be ceramic or PVDF, etc. The piezoelectric material 12 includes a surface 121 and an interior 122. The surface 121 is, for example, an upper surface 121a and/or a lower surface 121b. At least one of the surface 121 and the interior 122 is formed with a patterned processing zone 14, 14' (please refer to FIG. 2). Each patterned processing zone 14, 14' includes one of a material removal area 16 and a material modification area 18 (shown in the subsequent FIG. 4). Specifically, the material removal area 16 and/or the material modification area 18 may be selected to be formed on the surface 121 of the piezoelectric material 12; the material removal area 16 and/or the material modification area 18 may be selected to be formed in the interior 122 of the piezoelectric material 12; or the material removal area 16 and/or the material modification area 18 may be selected to be formed on the surface 121 and in the interior 122 of the piezoelectric material 12.

Please continue to refer to FIG. 3. FIG. 3 illustrates an implementation aspect in which the piezoelectric material 12 of the oscillator piezoelectric structure 10 has a material removal area 16. Specifically, the material removal area 16 is formed on the surface 121 of the piezoelectric material 12. The material removal area 16 has an implementation aspect in which the microstructure patterns are blind holes 16a, through holes 16b, recesses 16c (shown in the subsequent FIG. 5), grooves or a combination thereof, wherein the cross-sectional shape of the blind holes 16a, through holes 16b, and/or recesses 16c is, for example, a circle, a rectangle, a triangle, or other polygons. The sizes of the microstructure patterns may be the same or different. In the embodiment shown in FIG. 3, the material removal area 16 is, for example, a combination of blind holes 16a and through holes 16b. The blind holes 16a are, for example, formed on the upper surface 121a of the piezoelectric material 12 and have a certain depth. The through holes 16b penetrate, for example, the upper surface 121a, the interior 122, and the lower surface 121b. In one embodiment as shown in FIG. 3, the material removal areas 16 may be distributed on the peripheral area of the surface 121 and/or the peripheral area of the interior 122 of the piezoelectric material 12, but is not limited thereto. That is, in other embodiments not shown, the material removal areas 16 may be distributed evenly or in a matrix on the surface 121 and/or in the interior 122 of the piezoelectric material 12, or distributed non-evenly on the surface 121 and/or in the interior 122 of the piezoelectric material 12.

Figure 4:
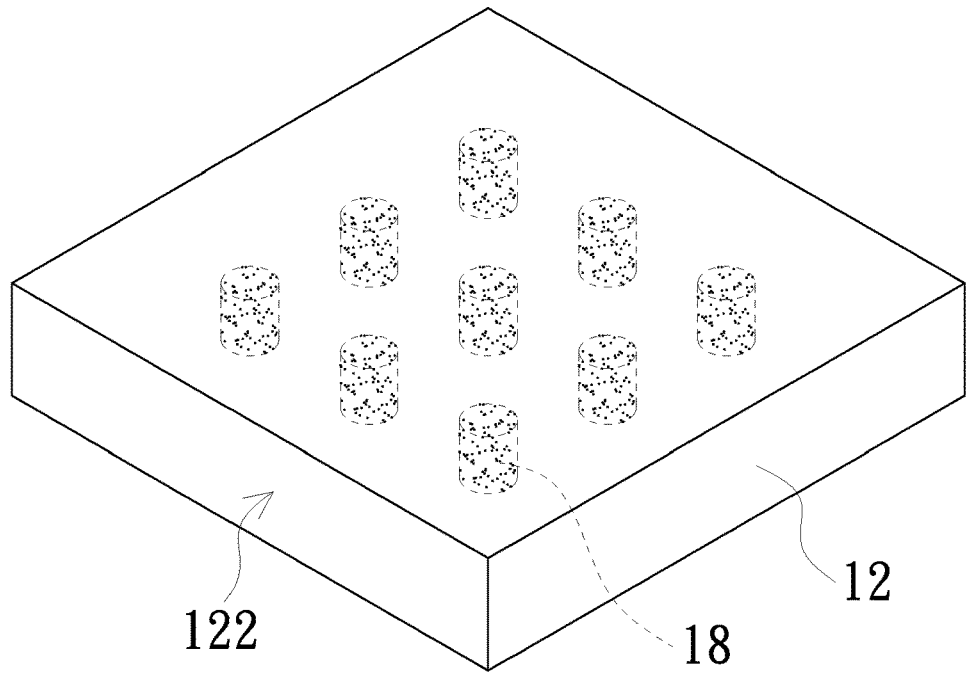
FIG. 4 is a structural schematic diagram of an oscillator piezoelectric structure according to another embodiment of the present invention.

FIG. 4 is a structural schematic diagram of an oscillator piezoelectric structure according to another embodiment of the present invention. FIG. 4 illustrates an implementation aspect in which the piezoelectric material 12 of the oscillator piezoelectric structure 10A has a material modification area 18. As shown in FIG. 4, a plurality of material modification areas 18 are, for example, formed in the interior 122 of the piezoelectric material 12. In FIG. 4, each material modification area 18 is represented by a gray-scale block to illustrate that the lattice structure of the material modification area 18 is changed, but the appearance of the piezoelectric material 12 will not be changed. In one embodiment as shown in FIG. 4, the cross-sectional shape of the material modification area 18 is, for example, a circle, and the material modification areas 18 are evenly arranged in the piezoelectric material 12, but are not limited thereto. The cross-sectional shape of the material modification area 18 may also be rectangle, triangle, or other polygons. The size of the material modification areas 18 may be the same or different, and the depths of the material modification areas 18 may be the same or different.

Figure 5:
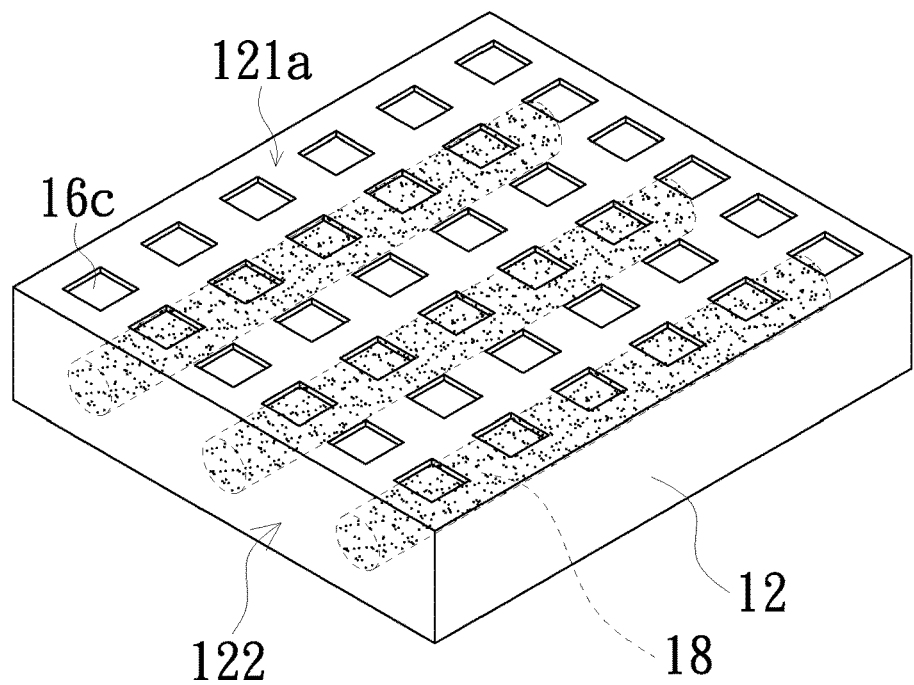
FIG. 5 is a structural schematic diagram of an oscillator piezoelectric structure according to another embodiment of the present invention.

FIG. 5 is a structural schematic diagram of an oscillator piezoelectric structure according to another embodiment of the present invention. FIG. 5 illustrates an implementation aspect in which the piezoelectric material 12 of the oscillator piezoelectric structure 10B has a material removal area 16 and a material modification area 18. As shown in FIG. 5, the material removal area 16 is formed on the upper surface 121a of the piezoelectric material 12, and the material modification area 18 is formed in the interior 122 of the piezoelectric material 12. The material removal area 16 is represented by a recess 16c, and the material modification area 18 is represented by a gray scale block. The shape, size, and distribution of the material removal area 16 and the material modification area 18 are not limited to those shown in the figure, and the material removal area 16 and the material modification area 18 are not limited to have consistent or inconsistent shapes or sizes.

Figure 6:
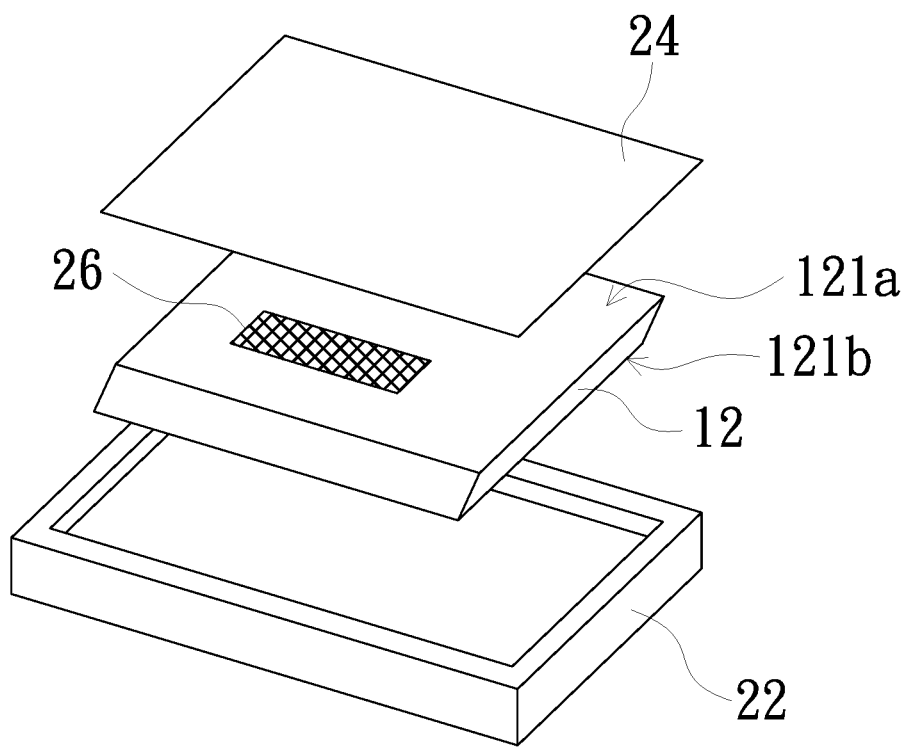
FIG. 6 is an exploded schematic diagram of an oscillator according to an embodiment of the invention.

FIG. 6 is an exploded schematic diagram of an oscillator according to an embodiment of the present invention. The oscillator 20 is, for example, a quartz oscillator. The oscillator 20 includes a base 22, an oscillator piezoelectric structure 10, and a cover 24. The cover 24 may be a conductive material or a non-conductive material. The oscillator piezoelectric structure 10 includes two electrode layers 26 respectively disposed on the upper surface 121a and the lower surface 121b of the piezoelectric material 12. FIG. 6 only shows the electrode layer 26 disposed on the upper surface 121a. The piezoelectric material 12 oscillates by applying a voltage signal to the two electrode layers 26. The oscillator piezoelectric structure 10 is disposed in the base 22, and the cover 24 is disposed on the base 22 to cover the oscillator piezoelectric structure 10.

According to the above description, a patterned processing zone is formed on the surface and/or in the interior of the piezoelectric material of the oscillator piezoelectric structure in the embodiment of the present invention, and the patterned processing zone includes a material removal area and/or a material modification area. When the oscillator piezoelectric structure is applied to an oscillator, the resonance frequency of oscillation can be modulated by the shape, size and/or distribution of the patterned processing zone formed on the piezoelectric material. Therefore, the oscillation frequency can be controlled more accurately, and the oscillator piezoelectric structure can also have the function of a spatial filter to block other unnecessary modes and their corresponding frequencies. In one embodiment, the oscillation mode is mainly a shear mode when the oscillator generates high-frequency oscillation, wherein the frequency of the high-frequency oscillation may be between 20 MHz and 100 MHz.

In addition, in the embodiment of the present invention, a pattern process is performed on the surface and/or in the interior of the piezoelectric material by a laser to form the microstructures such as the material modification areas and the material removal areas on the surface and/or in the interior of the piezoelectric material. Thus, compared with the conventional oscillation frequency modulation method by cutting and shaping the piezoelectric material to control the oscillation frequency of the shear mode, the oscillator frequency modulation method in the embodiment of the present invention uses laser to form a microstructure pattern to adjust the oscillation frequency of the shear mode of an oscillator. Therefore, the oscillator frequency modulation method of the embodiment of the present invention has the advantages of easy processing and capable of changing the oscillation frequency quickly and easily.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An oscillator frequency modulation method, comprising:
    providing a piezoelectric material, wherein the piezoelectric material has at least one surface and an interior; and
    performing a pattern process on the piezoelectric material by a laser to form a plurality of patterned processing zones on the at least one surface and in the interior of the piezoelectric material, wherein the pattern process comprises a material removal and a material modification, wherein the material modification is to change the material lattice structure of the piezoelectric material to change the material properties of the piezoelectric material, and a resonance frequency of oscillation is modulated by the shape and size of the patterned processing zones.

2. The oscillator frequency modulation method according to claim 1, wherein the patterned processing zones consist of blind holes, through holes, recesses, grooves, or a combination thereof.

3. The oscillator frequency modulation method according to claim 1, wherein the patterned processing zones are arranged in a peripheral area of the at least one surface and the interior of the piezoelectric material.

4. The oscillator frequency modulation method according to claim 1, wherein the patterned processing zones are distributed evenly or in a matrix on the at least one surface and in the interior of the piezoelectric material.

5. The oscillator frequency modulation method according to claim 1, wherein the piezoelectric material comprises quartz, ceramic, or polyvinylidene fluoride.

* * * * *